United States Patent [19]

Miwa et al.

[11] Patent Number: 5,633,112
[45] Date of Patent: May 27, 1997

[54] PHOTOSENSITIVE RESIN COMPOSITION CONTAINING A CARBOXYLIC ACID POLYMER, PHOTOACID GENERATOR AND SECONDARY OR TERTIARY ALIPHATIC AMINE

[75] Inventors: Takao Miwa, Katsuta; Yoshiaki Okabe; Mina Ishida, both of Hitachi; Akio Takahashi, Hitachiota; Shunichi Numata, Hitachi, all of Japan

[73] Assignees: Hitachi, Ltd.; Hitachi Chemical Company, Ltd., both of Tokyo, Japan

[21] Appl. No.: 319,788

[22] Filed: Oct. 7, 1994

[30] Foreign Application Priority Data

Oct. 8, 1993 [JP] Japan .................................. 5-252785

[51] Int. Cl.$^6$ ...................................................... G03F 7/021
[52] U.S. Cl. ........................ 430/176; 430/177; 430/188; 430/270.1
[58] Field of Search ................................ 430/176, 177, 430/188, 270, 270.1

[56] References Cited

U.S. PATENT DOCUMENTS 4,980,268  12/1990  Bartmann et al. ........................ 430/270

*Primary Examiner*—Christopher G. Young
*Attorney, Agent, or Firm*—Antonelli, Terry, Stout & Kraus, LLP

[57] ABSTRACT

A photosensitive resin composition comprising (a) a polymer having carboxyl groups (b) a photoacid generator which generates an acid when irradiated with light, and (c) an aliphatic amine is capable of development with ease by use of a wide variety of aqueous solvents.

8 Claims, No Drawings

PHOTOSENSITIVE RESIN COMPOSITION CONTAINING A CARBOXYLIC ACID POLYMER, PHOTOACID GENERATOR AND SECONDARY OR TERTIARY ALIPHATIC AMINE

BACKGROUND OF THE INVENTION

The present invention relates to a photosensitive resin composition, a pattern forming process using said resin composition and electronic devices using the same.

Photosensitive resin compositions may be classified into the polarity changeable type in which the polarity of the exposed portion is changed to produce a difference in solubility and the crosslinked type in which the crosslinking reaction is advanced by exposure to light and the exposed portion is insolubilized. The polarity changeable type can be utilized either as a positive type or as a negative type depending on the developing solution composition, but the crosslinked type is available only as a negative type in principle. The crosslinked type photosensitive material is also disadvantageous in carrying out fine working of high resolution because of the occurrence of swelling of the exposed portion by the developing solution. Further, from the standpoint of prevention of environmental pollution or improvement of working environment, the development of a photosensitive resin composition that can be developed with an aqueous solvent and supersede the conventional photosensitive resin compositions requiring use of a developing solution essentially comprising a chlorine type solvent or an organic solvent has been strongly desired.

Hitherto, polyimide resins having excellent heat resistance have been widely studied for use as an organic photosensitive resin.

For example, it is practiced in the art to coat a polyamide acid, which is a polyimide precursor, on a substrate, subject the coat to a heat treatment to convert polyamide acid and into polyimide, form a photoresist relief pattern on the polyimide film and selectively etch the polyimide with a hydrazine type etching agent to transfer the relief pattern to the polyimide.

However, since polyimide pattern formation in the above process involves the steps for coating of the photoresist and release thereof, the process is very complicated. Also, lowering of dimensional precison may occur due to transfer of the relief pattern through a resist. Thus, in order to realize simplification and higher accuracy of fine working, the development of a heat-resistant substance which is capable of direct fine working with light has been required.

As the materials that can serve the above purpose, there have been proposed various materials such as a photosensitive heat-resistant material composed of a polyamide acid and a bichromate (JP-B-49-17374), a photosensitive polyamide acid derived from a pyromellitic acid derivative (JP-A-49-112241), a photosensitive heat-resistant material composed of a polyamide acid and an unsaturated amine (JP-A-54-145794) and a photosensitive heat-resistant material made by reacting a polyamide acid and a saturated epoxy compound (JP-A-55-45746). However, all of the above-mentioned photosensitive materials are of the negative type prepared by using a crosslinking reaction. The sensitive materials made by applying a crosslinking reaction are disadvantageous in carrying out fine working of high resolution because of the occurrence of swelling of the exposed portion by the developing solution. Also, there are the occasions where a positive type photosensitive heat-resistant material is required from the nature of the process. Thus, a polarity changeable type photosensitive heat-resistant material has been required. As the materials that can serve the above purpose, there have been proposed positive type photosensitive heat-resistant materials (JP-B-1-59571 and JP-A-62-229242).

However, for obtaining said positive type photosensitive heat-resistant material, it has been necessary to use an acid chloride as monomer and to strictly control the working conditions such as reaction temperature, removal of moisture, etc., in the synthesis of said materials. Also, the produced precursor had problems relating to purity, such as the necessity to remove the chlorine ions. Further, since the photosensitive groups in said positive type photosensitive heat-resistant materials are attached to the polyimide precursor by strong covalent linkage, such groups are hard to eliminate in the course of imidization, giving an adverse influence to the produced film properties. The film developing characteristics were also unsatisfactory.

SUMMARY OF THE INVENTION

The present invention is intended to provide a polarity changeable type photosensitive resin composition which is soluble in water and capable of development with an aqueous solvent, and which can solve the above problems.

In order to attain the above object, the present invention employs the following technical means. The first means of the invention consists in providing a photosensitive resin composition characterized in that it contains (a) a carboxylic acid polymer having a molecular weight of 10,000 to 100,000 and repeating units represented by the formula (1):

wherein A is an organic group having 2 or more carbon atoms; n is a positive integer between 10 and 200,000; and $R_1$ is an organic group having 1 or more carbon atoms, a hydrogen atom or a halogen atom, the amount of said polymer being 20% or more by weight based on the total amount of the resin; (b) a photoacid generator which is capable of generating an acid upon application of electromagnetic waves, the amount of said agent being 0.2 to 2.0 molar equivalents per mole of the carboxyl group in said carboxylic acid polymer; and (c) a basic substance in an amount of 0.2 to 2.0 molar equivalents per mole of the carboxyl group in said carboxylic acid polymer, or 0.5 to 2.0 moles per mole of the photoacid generator (b).

The second means of the present invention is to provide a photosensitive resin composition containing a polymer having carboxyl groups, a photoacid generator (b) which comprises at least one of diazonium salts, sulfonic acid esters, sulfonates, nitrobenzyl esters, onium salts, halogenated isocyanurates and bisarylsulfonyl diazomethanes, and a basic substance.

The third means resides in providing a photosensitive resin composition containing a polymer having carboxyl groups, a photoacid generator and an alkylamine as basic substance.

The fourth means is to provide a photosensitive resin composition characterized in that it contains a compound having carboxyl groups, an acid generating agent and a basic substance, and that it is capable of forming a pattern by application of electromagnetic waves.

The fifth means consists in providing a pattern forming process characterized in that it comprises the step of coating on a substrate a photosensitive resin composition comprising (a) a carboxylic acid polymer having a molecular weight of 10,000 to 100,000 and repeating units represented by the formula (1):

wherein A is an organic group having 2 or more carbon atoms; n is a positive integer between 10 and 200,000; and $R_1$ is an organic group having 1 or more carbon atoms, a hydrogen atom or a halogen atom, the amount of said polymer being 20% or more by weight based on the total amount of the resin, (b) a photoacid generator which is capable of generating an acid upon application of electromagnetic waves, the amount of said agent being 0.2 to 2.0 molar equivalents per mole of the carboxyl group in said carboxylic acid polymer, and (c) a basic substance in an amount of 0.2 to 2.0 molar equivalents per mole of the carboxyl group in said carboxylic acid polymer or 0.5 to 2.0 moles per mole of the photoacid generator (b), and drying the coat; the step of applying electromagnetic waves to the coat through a light-shielding mask; and the step of development.

The sixth means consists in providing a liquid crystal oriented film pattern forming process using the photosensitive resin composition of the fourth means, and providing a large scale integrated circuit obtained by a circuit forming or protective film forming means comprising the step of coating on a substrate a photosensitive resin composition containing (a) a carboxylic acid polymer having a molecular weight of 10,000 to 100,000 and repeating units represented by the formula (1):

wherein A is an organic group having 2 or more carbon atoms; n is a positive integer between 10 and 200,000; and $R_1$ is an organic group having 1 or more carbon atoms, a hydrogen atom or a halogen atom, the amount of said polymer being 20% or more by weight based on the total amount of the resin, (b) a photoacid generator capable of generating an acid upon application of electromagnetic waves, the amount of said agent being 0.2 to 2.0 molar equivalents per mole of the carboxyl group in said carboxylic acid polymer, and (c) a basic substance in an amount of 0.2 to 2.0 molar equivalents per mole of the carboxyl group in said carboxylic acid polymer, and drying the coat; the step of applying electromagnetic waves to the coat through a light-shielding mask; and the step of development.

DESCRIPTION OF THE PREFERRED EMBODIMENTS

The present invention has been attained by making use of the fact that the solubility of the molecules having the carboxyl groups in the structure of the formula (1):

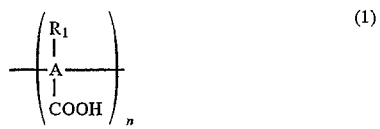

wherein A is a tetravalent organic group, such as tetravalent aromatic rings, tetravalent fluorinated aromatic rings, tetravlent fused rings, tetravlent alicyclic rings; tetravalent groups derived from saturated alkyl groups, unsaturated alkyl groups, fluorinated alkyl groups, a methylene group, aliphatic group-substituted methylene groups, aromatic ring-substituted methylene groups, etc., and a group of the formula:

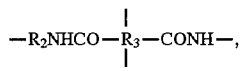

wherein $R_2$ and $R_3$ are as defined below, these groups preferably having 2 to 100 carbon atoms; n is an integer of 10 to 200,000; and $R_1$ is a monovalent organic group preferably having 1 to 20 carbon atoms such as a saturated alkyl group, an unsaturated alkyl group, a carboxyl group, an aromatic ring such as a phenyl group, a halogenated alkyl group, an amido group, a hydrogen atom, and a halogen atom, is greatly changed by the presence of a base. Therefore, in the present invention, any of the carboxylic acid polymers having the carboxyl groups in the molecular structure are usable. As the terminal groups for the formula (I), there can be exemplified —H, —OH, —$NH_2$, —COOH, etc. The molecular weight of the carboxylic acid polymer used in this invention is preferably not less than 10,000 in view of the mechanical properties of the relief pattern. The upper limit of the molecular weight is not particularly limited, but it is preferably set at 100,000 in view of solubility of the polymer in the solvent used.

As the repeating structural units which give the polymeric structure having the carboxyl groups through chain polymerization, those of the polyacrylic acids and alkyl polyacrylate derivatives shown in Table 9.1 and those of maleic acid, its derivatives, fluoroalkyl maleate and vinyl acetate shown in Table 14.1 in Polymer Data Handbook (compiled by the Society of Polymer Science, Japan and pub. by Baifukan, 1986) can be exemplified.

For example, the following acids and derivatives thereof can be used for preparing the carboxylic acid polymers: acrylic acid, acrylic anhydrid, acrolein, crotonic acid, isocrotonic acid, cis-2-pentenoic acid, trans-2-pentenoic acid, 2-ethyl acrylic acid, angelic acid, tiglic acid, 3,3-dimethyl acrylic acid, 3-propyl acrylic acid, trans-2-methyl-3-ethyl acrylic acid, cis-2-methyl-3-ethyl acrylic acid, 3-isopropyl acrylic acid, trans-3-methyl-3-ethyl acrylic acid, cis-2-methyl-3-ethyl acrylic acid, 2-ethyl-trans-crotonic acid, 2-ethyl-cis-crotonic acid, 2-isopropyl acrylic acid, trimethyl acrylic acid, 3-butyl acrylic acid, 2-buthyl acrylic acid, 2-methyl-2-hexenoic acid, 3-methyl-3-propyl acrylic acid, 2,3-diethyl acrylic acid, 4-methyl-2-hexanoic acid, 3,3-diethyl acrylic acid, 3-tert-buthyl acrylic acid, 2,3-dimethyl-3-ethyl acrylic acid, 3,3-dimethyl-2-ethyl acrylic acid, 3-methyl-3-isopropyl acrylic acid, 2-methyl-3-isopropyl acrylic acid, trans-2-octanoic acid, cis-2-octanoic acid, 2-penten acrylic acid, 2-buthyl crotonic acid, 2-ethyl-3-propyl acrylic acid, 4-ethyl-2-hexenoic acid, 2-methyl-3,3-diethyl acrylic acid, 3-methyl-3-tert-butyl acrylic acid, 2-hexyl acrylic acid, 2-methyl-3-pentyl acrylic acid, 3-methyl-3-pentyl acrylic acid, 3,3-dipropyl 2-methyl-3- pentyl acrylic acid, 3-methyl-2-ethyl-2-hexenoic acid, trans-2-decenoic acid, 3-methyl-3-hexyl acrylic acid, nonene-4-carboxylic acid, α-[N-acrylo]amino acrylic acid, α-acetoxy acrylic acid, α-(2-acetoxy ethyl)acrylic acid, α-acetoxy ethyl acrylic acid, α-acetylamino acrylic acid, α-(2-aminoethyl)acrylic acid, α-chloro acrylic acid, α-(2-chloro acetylamino)acrylic acid, α-methyl acrylic acid, α-(2,2,2-trifluoroacetylamino)acrylic acid, α-trifluoromethyl acrylic acid, α-trimethylsilyl acrylic acid, α-hydroxymethyl acrylic acid, α-fluoro acrylic acid, α-bromo acrylic acid, α-formyl acrylic acid, β-trans-aryloxy acrylic acid, β-trans-(ethylmercapt)acrylic acid, β-cis-chloro acrylic acid, β-trans-nitro acrylic acid, β-trans-butoxy acrylic acid, β-tcis-bromo acrylic acid, β-trans-bromo acrylic acid, β-trans-methylmercapt acrylic acid, β-cis-iodide acrylic acid, β-trans-acrylic acid, α-chloro-β-E-methoxy acrylic acid, α,β-dibromo acrylic acid, α,β-trans-dichloro acrylic acid, α,β-cis-dibromo acrylic acid, α,β-trans-dibromo acrylic acid, α,β-cis-diiodide acrylic acid, α,β-trans-diiodide acrylic acid, β-diamino acrylic acid, β-dichloro acrylic acid, β-dibromo acrylic acid, β-diiodide bromo acrylic acid, α-chloro-β-dibromo acrylic acid, β-chloro-α, β-dibromo acrylic acid, α-chloro-β-diiodide acrylic acid, α-fluoro-β-dichloro acrylic acid, α,β-dichloro-β-bromo acrylic acid, β-dichloro-α,-bromo acrylic acid, trichloro acrylic acid, dichloro acrylic acid, tribromo acrylic acid, α-bromo-β-diiodide acrylic acid, acrylic chloride, α-chloro acryl chloride, α-chloro acrylo fluoride, α-chloro-β-dibromo acrylo fluoride, β-chloro-α,β-dibromo acrylo bromide, β-dichloro-α-bromo acrylo bromide, trichloro acrylo chloride, trichloro acrylo bromide, sodium acrylate, methacrylic acid, methacrylic anhydride, methacrolein, methacryl chloride, methacryl fluoride, methacryl bromide, β-bromo methacryl chloride; maleic acid, methyl maleic acid, dimethyl maleic acid, phenyl maleic acid, chloro maleic acid, dichloro maleic acid, fluoro maleic acid, difluoro maleic acid, bromo maleic acid, male amide acid, N-methyl male amide acid, N-ethyl male amide acid, N-n-propyl methyl male amide acid, N-isopropyl male amide acid, N-n-buthyl male amide acid, N-hexyl male amide acid, N-cyclohexyl male amide acid, N-phenyl male amide acid, etc. Any of the polymers containing the monomers shown above and those having the monomers shown above as copolymerization materials can be used in the form as they are in the present invention. Also, the polymers having no carboxyl group in the monomers at the time of polymerization can be made applicable in the present invention by introducing the carboxyl groups by chemical modification.

The effect of the present invention becomes more conspicuous when the structure of the above-shown formula (1) is defined by the one shown by the formula (2):

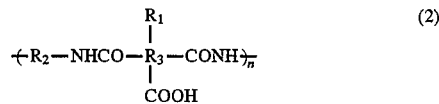

(2)

wherein $R_1$ and n are as defined above; $R_2$ is a divalent organic group having preferably 2 to 50 carbon atoms such as those derived from saturated alkyl groups, unsaturated alkyl groups, fluorinated alkyl groups, alicyclic compounds, aromatic rings, fluorinated aromatic rings, etc.; and $R_3$ is a tetravalent organic group preferably having 4 to 70 carbon atoms and derived from saturated alkyl groups, unsaturated alkyl groups, fluorinated alkyl groups, alicyclic compounds, aromatic rings, fused rings, fluorinated aromatic rings, etc.

For example, as the polycondensation type polymers, polyamide acids and chitin can be mentioned as the typical polymers having the carboxyl groups. Especially when the present invention is applied to polyamide acids, it is possible to obtain a relief image with excellent heat resistance and chemical resistance by effecting polyimide conversion by heating or chemical means after forming the relief image. The obtained film, therefore, shows its excellent performance in use as a protective film for LSI or an insulating film for wiring boards. The polyamide acid used in the present invention can be obtained from a reaction of a diamine or diisocyanate with a tetracarboxylic acid or a derivative thereof.

Examples of the tetracarboxylic acids and derivatives thereof are as follows: 1,4-bis-(2,3-dicarboxyphenoxy)-benzene dianhydride, 2,2-bis-(3,4-dicarboxyphenyl)-propane dianhydride, di-(3,4-dicarboxyphenyl)methane dianhydride, m-terphenyl-3,4,3",4"-tetracarboxylic acid dianhydride, methyltrifluoromethyl-xanthene-tetracarboxylic acid dianhydride, 1,4,5,8-tetracarboxynaphthalene dianhydride, 2,3,6,7-tetracarboxynaphthalene dianhydride, di-(3,4-dicarboxyphenyl)ether dianhydride; 3,3,9,10-perylenetetracarboxylic dianhydride, 1,2,4,5-tetracarboxybenzene dianhydride, 3-phenyl-PMDA, diphenyl-xanthene-tetracarboxylic acid dianhydride, 1,3-bis(3,4-dicarboxyphenoxy)-benzene dianhydride, 5,5'-[(2,2',3, 3'-tetrahydro-3,3,3',3'-tetramethyl-1,1'-spirobi-[1H-indene]-6,6'-diyl)bis-(oxy)]bis-1,3-isobenzofurandione, di-(3,4-dicarboxyphenyl)-sulfide dianhydride, di-(2,3-dicarboxyphenyl)-sulfide dianhydride, bis(3,4-dicarboxyphenyl)dimethylsilane dianhydride, di-(3,4-dicarboxyphenyl)sulfone dianhydride, 3,4,7,8-tetracarboxy-tricyclo[4,2,2,0(2,5)]dec-9-ene dianhydride, 1,2,4-tricarboxybenzene dianhydride, 1,3-bis-(3,4-dicarboxybenzoyl)-2,4,6-trimethylbenzene dianhydride, 3,3",4,4"-tetracarboxy-p-terphenyl dianhydride, 3,3',4,4'-tetracarboxy-triphenylphosphine oxide dianhydride, 1,4-diamino-2-fluorobenzene, 1,4-bis-(p-aminophenoxy)-tetrafluorobenzene, 1,3-diamino-2,4,5,6-tetrafluorobenzene, 1,4-diamino-2,3,5,6-tetrafluorobenzene, 1,3-diamino-5-trifluoromethylbenzene, 6-amino-2-(p-aminophenyl) benzimidazole, 2,2-bis-(m-aminophenyl)-hexafluoropropane, 2,2-bis-[4-(m-aminophenoxy)phenyl]-hexafluoropropane, 2,2-bis-[4-(o-aminophenoxy)phenyl]-hexafluoropropane, 2,2-bis-(p-aminophenyl)-hexafluoropropane, 2,2-bis-[4-(p-aminophenoxy)phenyl]-hexafluoropropane, 4-(4'-aminobenzyl)cyclohexylamine, 4,4'-diamino-2,2',3,3',5,5',6,6'-octafluoro-biphenyl, 4,4'-diamino-2,2',3,3',5,5',6,6'-octafluorodiphenyl ether, bis(4-aminocyclohexyl)methane, 5-amino-1-(p-aminophenyl)-1, 3,3-trimethylindane, 1,3-bis-(4-aminocumyl)-benzene, 1,3-bis[4-(m-aminophenoxy)benzoyl]benzene, 1,4-bis-(4'-aminocumyl)-benzene, 9,9-bis-(p-aminophenyl)-fluorene, 2,6-diamino-benzobisthiazole, 4,4'-bis-(3-amino-5-trifluoromethylphenoxy)-biphenyl, 3,6-difluoro-1,2,4,5-tetracarboxybenzene dianhydride, 9-phenyl-9-(trifluoromethyl)xanthene-2,3,6,7-tetracarboxylic acid dianhydride, 1,1-bis-(3,4-dicarboxyphenyl)-2,2,2-trifluoroethylbenzene dianhydride, 9,9-bis(trifluoromethyl) xanthene-2,3,6,7-tetracarboxylic acid dianhydride, 2,2-bis (3,4-dicarboxyphenyl)hexafluoropropane dianhydride, 2,2-bis-[(3,4-dicarboxyphenoxy)phenyl]-hexafluoropropane dianhydride, bis(3,4-dicarboxycyclohexen-1-yl) tetramethyldisiloxane dianhydride, decafluoro-1,4-bis-(3,4-dicarboxyphenoxy)benzene dianhydride, 4,4'-bis(3,4-dicarboxy-2,5,6-trifluorophenoxy)octafluorobiphenyl dianhydride, azo-di-phthalic anhydride, 1,3-bis(3,4-dicarboxybenzoyl)benzene dianhydride, 4,4'-bis-(3,4-dicarboxyphenoxy)biphenyl dianhydride, bicyclo[2.2.1]

heptane-2-exo-3-exo-5-exo-6-exo-tetracarboxylic dianhydride, 3,3',4,4'-tetracarboxybenzhydrol dianhydride, 2,2-bis-[4-(3,4-dicarboxyphenoxy)phenyl]-propane dianhydride, 2,2-bis-[4-(2,3-dicarboxyphenoxy)phenyl]-propane dianhydride; bis-phenol-A bis-naphthalic anhydride, 2,2-bis-[4-(3,4-dicarboxybenzoyloxy)phenyl]-propane dianhydride, 3,3',4,4'-tetracarboxybiphenyl dianhydride, 2,2',3,3'-tetracarboxybiphenyl dianhydride, 2,3,3',4'-tetracarboxybiphenyl dianhydride, 3,3',4,4'-tetracarboxybenzophenone dianhydride, 1,2,3,4-tetracarboxycyclobutane dianhydride, 1,2,3,4-tetracarboxycyclohexane dianhydride, 1,2,4,5-tetracarboxycyclohexane dianhydride, 3,3'-bis-(3,4-dicarboxyphenoxy)diphenylmethane dianhydride, di-[4-(3,4-dicarboxyphenoxy)phenyl]-ether dianhydride, di-[4-(3,4-dicarboxyphenoxy)phenyl]-sulfide dianhydride, 3,6-diphenyl-pyromellitic dianhydride, 5,6-diphenylprehnitic dianhydride, bisiloxane-bis-nadic anhydride, bisiloxane oligomer-bis-nadic anhydride, bis(3,4-dicarboxyphenyl) tetramethyldisiloxane dianhydride, disiloxane of 5-methylene-nadic anhydride, 1,4-bis-(3,4-dicarboxyphenoxy)-benzene dianhydride.

Needless to say, halides thereof, hydrolyzed products thereof and esterified products thereof can also be used.

Examples of the diamine are as follows: 1,4-bis-(3-amino-5-trifluoromethylphenoxy)-benzene, 1,3-bis-(m-aminobenzoyl)benzene, 4,4'-bis-(m-aminobenzoyl) biphenyl, 4,4'-bis-(m-aminophenoxy)-biphenyl, 1,1'-bis-(m-aminophenoxy)-diphenyl sulfide, 4,4'-bis-(m-aminophenoxy)-diphenyl sulfone, 2,2-bis-[4-(m-aminophenoxy)phenyl]-propane, 1,3-bis-(m-aminophenoxy)-benzene, 4,4'-bis-(m-aminophenoxy) triphenyl phosphine oxide, 1,4-bis-[4'-(p-aminophenoxy) cumyl]-benzene, 1,3-bis[4'-(p-aminophenoxy)cumyl]-benzene, 4,4'-bis-(p-aminophenoxy)biphenyl, 2,2'-bis(p-aminophenoxy)biphenyl, 3,3'-bis(p-aminophenoxy)-biphenyl, 1,3-bis-[4-(p-aminophenoxy)benzoyl]-benzene, 1,4-bis[4-(p-aminophenoxy)benzoyl]-benzene, 4,4'-bis-(p-aminophenoxy)-benzophenone, 1,1',2,2'-bis(p-aminophenoxy)-1,1'-binaphthyl, 1,3-bis-(p-aminophenoxy)-2,2-dimethyl-propane, 4,4'-bis-(p-aminophenoxy)-diphenyl ether, 4,4'-bis-(p-aminophenoxy)-diphenyl sulfide, 4,4'-bis-(p-aminophenoxy)-diphenyl sulfone, 2,5-bis-(p-aminophenyl)-3,4-diphenyl-thiophene, 1,2-bis-(p-aminophenyl)-ethane, 1,4-bis-(p-aminophenoxy)-benzene, 1,5-bis-(p-aminophenoxy)-naphthalene, 1,6-bis-(p-aminophenoxy)-naphthalene, 2,3-bis-(p-aminophenoxy)-naphthalene, 2,6-bis-(p-aminophenoxy)-naphthalene, 2,7-bis(p-aminophenoxy)naphthalene, bis-3,4-(p-aminophenyl)- 2,5-diphenylthiophene, 2,2-bis-(p-aminophenyl)-propane, 1,1-bis-[4-(p-aminophenoxy)-phenyl]-cyclobutane, 9,9-bis-[4-(p-aminophenoxy)phenyl] fluorene, 2,2-bis-[4-(p-aminophenoxy)phenyl]-propane, 3,3-bis[4-(p-aminophenoxy)phenyl]phthalide, N-phenyl-3,3-bis[4-(p-aminophenoxy)phenyl]phthalimidine, 1,3-bis-(p-aminophenoxy)-benzene, 1,1-bis-(p-aminophenyl)-2,2,2-trifluoroethylbenzene, 1,4-bis-(p-aminothiophenoxy)-benzene, 4,4'-bis-(p-aminophenoxy)-triphenyl phosphine oxide, 2,5-bis(p-aminophenoxy)phenyl-1,3,4-oxadiazole, 1,3-bis-[p-(3,4-dicarboxyphenoxy)cumyl]benzene dianhydride, 2,2'-bis-(trifluoromethyl)-4,4'-diaminobiphenyl, 3,3'-bis(trifluoromethyl)-5,5'-diaminodiphenyl ether, 1,3-bis[3-(p-aminophenoxy) benzoyl]-benzene, 3,6-diaminoacridine, 4,4'-diaminoazobenzene, 1,4-diaminoanthraquinone, 1,5-diaminoanthraquinone, 2,6-diaminoanthraquinone, 4,4'-diaminobiphenyl, 2,5-diaminobiphenyl, 4,4'-diaminobenzanilide, 3,3'-diaminobenzanilide, 4,4'-diaminobenzophenone, 3,3'-diaminobenzophenone, 2,4-diaminobenzoic acid, 4,4'-diamino-[1,1']-binaphthyl, 5,5'-diamino-2,2'-bipyridine, 2,2'-diamino-bis-phenol-A, 3,6-diamino-2,7-dimethylacridine, 4,4'-diaminodiphenylsulfide, 4,4'-diaminodiphenylsulfone, 3,3'-diaminodiphenylsulfone, 4,4'-diaminotriphenylphosphine, 4,4'-diamino-4"-nitrotriphenylamine, 1,5-diaminonaphthalene, 2,4-diaminophenol, 4-aminophenyl-4'-aminobenzoate, 2,6-diaminopyridine, 4,4"-diamino-p-terphenyl, 4,4'-diaminotriphenylamine, 4,4'-diamino-tetraphenylethylene, 2,2'-dichloro-4,4'-diaminobiphenyl, 2,2'-dimethyl-4,4'-diaminobiphenyl, 3,3'-dimethyl-4,4'-diaminobiphenyl, 3,3'-dimethyl-4,4'-diaminodiphenylmethane, 3,3'-diaminodiphenyl acetylene, 1,3-bis-(gamma-aminopropyl) tetramethyl-disiloxane, 1,6-diaminohexane, 4,4'-diaminodiphenylmethane, 3,3'-diaminodiphenylmethane, 1,3-diaminobenzene, 1,3-diaminomethylbenzene, 4,4'-diaminodiphenyl ether, 2,4'-diaminodiphenylether, 3,3'-diaminodiphenylether, 3,4'-diaminodiphenylether, p-aminophenyl-tetramethyldisiloxane, p-aminophenyltetramethyldisiloxane-oligomer, 1,4-diaminobenzene, 1,4-diaminomethylbenzene, bis[4-(gamma-aminopropyl)phenyl]tetramethyl disiloxane, 3,3',4,4'-tetraaminobiphenyl, 3,3',4,4'-tetraaminodiphenyl ether, 2,4-diaminotoluene, 2,6-diamino-4-trifluoromethylpyridine, 4,4'-diamino-3,3',5,5'-tetramethylbiphenyl, 4,4'-diamino-3,3',5,5'-tetramethyldiphenyl methane, 2,3,5,6-tetramethyl-1,4-diaminobenzene, etc.

As the diisocyanates, there can be used diisocyanates derived from the above-mentioned diamines. The tetracarboxylic acid derivatives usable here include acid anhydrides and acid chlorides. Use of an acid anhydride is preferred from the viewpoints of reactivity and suppressed formation of by-products. As examples of the diamines and acid anhydride derivatives usable in this invention, those shown in JP-A-61-181829 can be cited.

As the photoacid generator usable in this invention, the compounds such as diazonium salts, sulfonic acid esters, sulfonates, nitrobenzyl esters, onium salts, halogeted isocyanurates and bisarylsulfonyldiazomethane can be exemplified. Concrete examples of the photoacid generators are as follows:

diphenyliodonium tetrafluoroborate,
diphenyliodonium hexafluorophosphate,
diphenyliodonium hexafluoroantimonate,
diphenyliodonium trifluoromethylsulfonate,
4-methoxydiphenyliodonium hexafluoroantimonate,
4-methoxydiphenyliodonium trifluoromethylsulfonate,
4,4'-di-tert-butyliodonium tetrafluoroborate,
4,4'-di-tert-butyliodonium hexafluorophosphate,
4,4'-di-tert-butyliodonium hexafluoroantimonate,
4,4'-di-tert-butyliodonium trifluoromethylsulfonate,
triphenylsulfonium tetrafluoroborate,
triphenylsulfonium hexafluorophosphate,
triphenylsulfonium hexafluoroantimonate,
triphenylsulfonium trifluorosulfonate,
4-methoxytriphenylsulfonium hexafluoroantimonate,
4-methoxytriphenylsulfonium trifluoromethylsulfonate,
4-methyltriphenylsulfonium hexafluoroantimonate,
4-methyltriphenylsulfonium trifluoromethylsulfonate,
4-fluorotriphenylsulfonium trifluoromethylsulfonate,
2,4,6-trichloromethyl-triazine, 2,6-dichloromethyl-4-(4-chlorophenyl)triazine,
2,6-dichloromethyl-4-(4-methoxyphenyl)triazine,
1,2,3-tris(methanesulfonyloxy)benzene,
benzoin tosylate,
4-tert-butylphenyl-(4-toluenesulfonyl acetate), etc.

The synthesis processes and properties of these compounds are described in Photopolymer Technology (Nikkan Kogyo Shimbunsha, ISBN 4-526-02457-0) and the cited literature therein, and it is easy for a researcher in this field to synthesize a desired acid generating agent. Any of these compounds is decomposed on irradiation with light to generate an acid.

Any of the basic substances which are reacted with carboxylic acid to change solubility of the polymer can be used in the present invention. For obtaining water solubility by acid formation, it is generally preferable to use a compound having 12 or less carbon atoms in the molecule. Examples of such compounds are secondary and tertiary aliphatic amines having 12 or less carbon atoms. Further, use of 2-dimethylaminoethanol, 2-diethylaminoethanol, 2-methylaminodiethanol, 2-dimethylamino-3-butanone, 2-diethylaminoacetone, N-methylaminodiethanol, N-methylaminoethanol, 2,2-aminodiethanol, 3-diethylamino-1-propanol, aminocyclohexanone or the like is preferable from the viewpoints of smell and stability of the solution.

In the present invention, it is desirable to use as the electromagnetic waves light rays with a wavelength of 10 μm to 1 nm, preferably 1 nm to 900 nm.

The photosensitive resin composition of the present invention can be easily obtained by mixing, for example, a polyamide acid (a) synthesized by a conventional method such as mentioned above, a photoacid generator (b) and a basic substance (c). Needless to say, it is possible to incorporate a triplet sensitizer, an adhesion improver composed of various types of amine compounds, a surfactant, etc., in the composition of the present invention.

The basic substance reacts with the carboxylic acid in the polymer to form a carboxylate. The acid generated by light irradiation is reacted with the carboxylic acid in the polymer to change solubility of the polymer. Specifically, the polymer moiety which has become carboxylic acid from the reaction of an acid and a basic substance is reduced in solubility in water while enhanced in solubility in organic solvents. This makes it possible to obtain a negative image when an aqueous agent with high polarity is used as developing solution and to obtain a positive image when using an organic solvent as developing solution. Since linkage between the carboxyl group and the basic substance and linkage between the generated acid and the basic substance is weak, they are easily released in the course of imidization and a relief pattern with excellent film quality can be obtained. Since this relief pattern is based on salt formation, the amounts of the carboxylic acid, acid generating agent and basic substance in the resin composition become a key factor.

As a result of the studies on the mixing ratios of these materials, it was found that a good relief pattern can be obtained when the amount of carboxylic acid polymer added is 20% or more by weight based on the whole resin composition. As the polymer (or resin) other than the carboxylic acid polymer, there can be used any water-soluble polymers. Examples of the water-soluble polymers are polyvinyl alcohol, poly(ethylene oxide), poly(vinyl methyl ether), polyacrylamide, etc. These polymers can be mixed with the carboxylic acid polymer, or monomers for these polymers can be copolymerized with the monomers for producing the carboxylic acid polymer. It is possible to copolymerize styrene, acrylic esters, methacrylic esters, etc., these monomers unable to produce water-soluble homopolymers, so long as the resulting copolymers do not damage the water solubility. It was also found that a good relief pattern can be obtained when both the amount of the photoacid generator (b) and the amount of the basic substance (c) are 0.2 to 2.0 molar equivalents per mole of the carboxyl group in the carboxylic acid polymer or 0.5 to 2.0 moles of the basic substance (c) per mole of the photoacid generator (b). When said amounts were less than 0.2 molar equivalents or greater than 2.0 molar equivalents per mole of the carboxyl group in the carboxylic acid polymer, it was impossible to obtain a good relief pattern.

The acid generated upon irradiation with light is reacted with the carboxylate in the polymer to change solubility of the polymer in water, enabling development of the exposed and non-exposed portions. Since linkage between the carboxyl group and the generated acid or between the carboxyl group and acid generating agent is weak, said group is easily released to give a relief pattern with excellent film quality.

The present invention is illustrated by way of the following Examples.

EXAMPLE 1

3,3',4,4'-Biphenyltetracarboxylic acid dianhydride (BPDA) and the equivalent amount of p-phenylenediamine (PDA) were reacted in N-methyl-2-pyrrolidone (NMP) to obtain a polyamide acid. This polyamide acid was reprecipitated in water and dried. To this polyamide acid were added dimethylaminoethanol in an amount of 2 equivalents to BPDA and water as solvent to obtain a polyamide acid salt solution with a solid content of 5 wt %. To this polyamide acid salt solution was added an NMP solution of o-naphthoquinonediazido-5-sulfonic acid ester in an amount of 2 equivalents to BPDA to obtain a photosensitive resin composition. This photosensitive resin composition was spin coated on a glass substrate, dried at 100° C. and exposed to light from a high pressure mercury lamp through a light-shielding mask. When the formed film was developed in water, there could be obtained a relief pattern with substantially no erosion of the exposed portion. One-hour heat treatment at 300° C. gave a tough relief pattern.

EXAMPLES 2-5

The procedure of Example 1 was carried out with the amount of o-naphthoquinonediazido-5-sulfonic acid ester being changed to 0.3, 0.5, 1.0 and 1.5 equivalents, respectively, to BPDA. As a result, there could be obtained the relief patterns with substantially no erosion of the exposed portion as in Example 1.

EXAMPLE 6

3,3',4,4'-Biphenyltetracarboxylic acid dianhydride (BPDA) and the equivalent amount of p-phenylenediamine (PDA) were reacted in N-methyl-2-pyrrolidone (NMP) to obtain a polyamide acid. This amidic acid was reprecipitated in water and dried. To this acid were added dimethylaminoethanol in an amount of 2 equivalents to BPDA and water as solvent to obtain a polyamide acid salt solution with a solid content of 5 wt %. To this polyamide acid salt solution was added a benzeneazonium salt (borofluoride) of an amount of 2 equivalents to BPDA to obtain a photosensitive resin composition. This photosensitive resin composition was spin coated on a glass substrate, dried at 100° C. and exposed to light from a high-pressure mercury lamp through a light-shielding mask. When this film was developed in water, there could be obtained a relief pattern with substantially no erosion of the exposed portion. One-hour heat treatment at 300° C. gave a tough relief pattern.

EXAMPLE 7

The procedure of Example 1 was carried out with o-naphthoquinonediazido-5-sulfonic acid ester being replaced with diphenyliodonium salt. As a result, there could be obtained a relief pattern with substantially no erosion of the exposed portion as in Example 1.

EXAMPLE 8

The procedure of Example 1 was carried out using phthalimidyl trifluoromethyl sulfonate in place of o-naphthoquinonediazido-5-sulfonic acid water. As a result, there could be obtained a relief pattern with substantially no erosion of the exposed portion as in Example 1.

EXAMPLE 9

The procedure of Example 1 was carried out using pyromellitic dianhydride in place of BPDA. As a result, there could be obtained a relief pattern with substantially no erosion of the exposed portion as in Example 1.

EXAMPLE 10

The procedure of Example 1 was carried out with BPDA replaced with pyromellitic dianhydride (PMDA). As a result, there could be obtained a relief pattern with substantially no erosion of the exposed portion as in Example 1.

EXAMPLE 11

The procedure of Example 1 was carried out by replacing BPDA with pyromellitc dianhydride (PMDA) while replacing PDA with oxydianiline (ODA). As a result, there could be obtained a relief pattern with substantially no erosion of the exposed portion as in Example 1.

EXAMPLE 12

The procedure of Example 6 was carried out with benzodiazonium salt (borofluoride) replaced with a p-dimethylaminobenzenediazonium salt (borofluoride). As a result, there could be obtained a relief pattern with substantially no erosion of the exposed portion as in Example 6.

EXAMPLE 13

The procedure of Example 6 was carried out with benzenediazonium salt (borofluoride) replaced with a p-aminobenzenediazonium salt (borofluoride). As a result, there could be obtained a relief pattern with substantially no erosion of the exposed portion as in Example 6.

EXAMPLE 14

The procedure of Example 13 was carried out with water in the developing solution being replaced with an NMP/water mixed solution (NMP:water=4:1). As a result, there could be obtained a relief pattern with substantially no erosion of the non-exposed portion. One-hour heat treatment at 300° C. gave a tough relief pattern.

Comparative Example 1

The procedure of Example 1 was carried out without adding o-naphthoquinonediazido-5-sulfonic acid ester. As a result, both exposed portion and non-exposed portion were eroded.

The present invention provides a photosensitive resin composition which is capable of development with ease by use of a wide variety of aqueous solvent. The invention can contribute to realization of higher density and higher reliability of the electronic devices such as semiconductor devices and liquid crystal display devices, and its industrial value is high.

What is claimed is:

1. A photosensitive resin composition comprising (a) a carboxylic acid polymer having repeating units represented by the formula (1):

wherein A is an organic group having 2 or more carbon atoms; n is a positive integer between 10 and 200,00; and $R_1$ is an organic group having 1 or more carbon atoms, a hydrogen atom or a halogen atom, the amount of said polymer being 20% or more by weight based on the total amount of the resin in the composition;

(b) a photoacid generator which is capable of generating an acid upon application of electromagnetic waves, the amount of said acid being 0.2 to 2.0 molar equivalents per mole of the carboxyl group in said carboxylic acid polymer; and (c) a secondary or tertiary aliphatic amine having 12 or less carbon atoms in an amount of 0.2 to 2.0 molar equivalents per mole of the carboxyl group in said carboxylic acid polymer.

2. A photosensitive resin composition according to claim 1, wherein the unit represented by formula (1) has a structural formula (2):

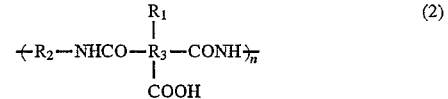

wherein $R_1$ is an organic group having 1 or more carbon atoms, a hydrogen atom or a halogen atom; n is an integer of 10 to 200,000; $R_2$ is an organic group having 2 or more carbon atoms; and $R_3$ is an organic group having 4 or more carbon atoms.

3. A photosensitive resin composition according to claim 1, wherein the photoacid generator (b) is at least one member selected from the group consisting of diazonium salts, sulfonic acid esters, sulfonates, nitrobenzyl esters, onium salts, halogenated isocyanurates and bisarylsulfonyldiazomethanes.

4. A photosensitive resin composition according to claim 1, wherein said aliphatic amine (c) is an alkylamine compound.

5. A photosensitive resin composition according to claim 1, wherein the aliphatic amine is 2-dimethylaminoethanol, 2-diethylaminoethanol, 2-methylaminodiethanol, 2-dimethylamino-3-butanone, 2-diethylaminoacetone, N-methylaminodiethanol, N-methylaminoethanol, 2,2-aminodiethanol, 3-diethylamino-1-propanol, or aminocyclohexanone.

6. A photosensitive resin composition according to claim 1, wherein said composition can be developed with water or a mixture of water and N-methyl-2-pyrrolidone.

7. A photosensitive resin composition comprising (a) a polymer having carboxyl groups, (b) a photoacid generator and (c) a secondary or tertiary aliphatic amine having 12 or less carbon atoms, and said composition being capable of forming a pattern by application of electromagnetic waves.

8. A photosensitive resin composition according to claim 7, wherein the photoacid generator is at least one member selected from the group consisting of diazonium salts, sulfonic acid esters, sulfonates, nitrobenzyl esters, onium salts, halogenated isocyanurates and bisarylsulfonyldiazomethanes.

* * * * *